(12) United States Patent
Hsieh et al.

(10) Patent No.: US 12,033,902 B2
(45) Date of Patent: Jul. 9, 2024

(54) MID-MANUFACTURING SEMICONDUCTOR WAFER LAYER TESTING

(71) Applicant: Taiwan Semiconductor Manufacturing Company, Ltd., Hsinchu (TW)

(72) Inventors: Feng-Chien Hsieh, Pingtung County (TW); Ting-Hao Chang, Hsinchu (TW); Chun-Hao Lin, Tainan (TW); Yun-Wei Cheng, Taipei (TW); Kuo-Cheng Lee, Tainan (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 17/463,556

(22) Filed: Sep. 1, 2021

(65) Prior Publication Data
US 2022/0301950 A1    Sep. 22, 2022

Related U.S. Application Data

(60) Provisional application No. 63/163,777, filed on Mar. 19, 2021.

(51) Int. Cl.
*H01L 21/66*    (2006.01)
*H01L 21/265*   (2006.01)
*H01L 27/144*   (2006.01)

(52) U.S. Cl.
CPC ............ *H01L 22/20* (2013.01); *H01L 21/265* (2013.01); *H01L 22/22* (2013.01); *H01L 22/30* (2013.01); *H01L 27/1443* (2013.01)

(58) Field of Classification Search
None
See application file for complete search history.

(56) References Cited

U.S. PATENT DOCUMENTS

| | | | |
|---|---|---|---|
| 6,605,479 B1 * | 8/2003 | Pasadyn | H01L 22/20 438/18 |
| 2007/0238204 A1 * | 10/2007 | Kurihara | H01L 22/20 257/E21.525 |
| 2018/0364278 A1 * | 12/2018 | Hagmann | G01Q 60/12 |

OTHER PUBLICATIONS

David, CN 107004060A, Improved Process Control Techniques for Semiconductor Fabrication Processes, Aug. 1. 2017 (Year: 2017).*

(Continued)

*Primary Examiner* — Alexander G Ghyka
(74) *Attorney, Agent, or Firm* — Kilpatrick Townsend & Stockton LLP

(57) ABSTRACT

A method of manufacturing a semiconductor wafer is disclosed. The method includes exposing the semiconductor wafer to one or more dopant species to form one or more first implant layers on the semiconductor wafer, testing one or more geometric parameter values of the formed one or more first implant layers, after testing the one or more geometric parameter values, conditionally exposing the semiconductor wafer to one or more dopant species to form one or more additional implant layers on the semiconductor wafer, after forming the one or more additional implant layers, conditionally forming one or more additional circuit layers on the semiconductor wafer to form a plurality of functional electronic circuits on the semiconductor wafer, and conditionally testing the semiconductor wafer with a wafer acceptance test (WAT) operation.

20 Claims, 10 Drawing Sheets

SRP

(56) References Cited

OTHER PUBLICATIONS

Pinaton et al, FR 2776375A1, Characterization of an Ion Implantation Process Especially for Monitoring Ion Implantation of Silicon Wafers in IC Manufacture, Sep. 24, 1999 (Year: 1999).*

* cited by examiner

800

| | |
|---|---|
| OD | ~802 |
| FLD | ~804 |
| Logic | ~806 |
| DPW | ~808 |
| CPW | ~810 |
| DNPPD | ~812 |
| GATE OX | ~818 |
| PO PH | ~820 |
| NPPD | ~822 |
| POHM RM | ~824 |
| Logic LDD | ~826 |
| PPPD | ~830 |
| SW | ~832 |
| N+ S/D | ~836 |
| P+ S/D | ~838 |
| PPPD | ~840 |
| RPO | ~842 |
| ILD | ~844 |
| CT | ~846 |
| WAT | ~848 |

Fig. 8

SSRM

SRP

MID-MANUFACTURING SEMICONDUCTOR WAFER LAYER TESTING

TECHNICAL FIELD

The subject matter described herein relates to semiconductor testing, and more particularly to monitoring of semiconductor layers during a manufacturing process.

BACKGROUND

Semiconductor manufacturing processes include numerous fabrication steps or processes, each of which contributes to the formation of one or more semiconductor layers. Each layer may be formed, for example, by doping sections of a crystalline semiconductor substrate. In addition, one or more layers may be formed by adding, for example, conductive, resistive, and/or insulative layers on the crystalline semiconductor substrate.

Due to manufacturing variation one or more of the fabricated layers may be defective.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates a schematic view of a semiconductor circuit manufacturing process in accordance with some embodiments.

When practical, similar reference numbers denote similar structures, features, or elements.

DETAILED DESCRIPTION

Figure 1:
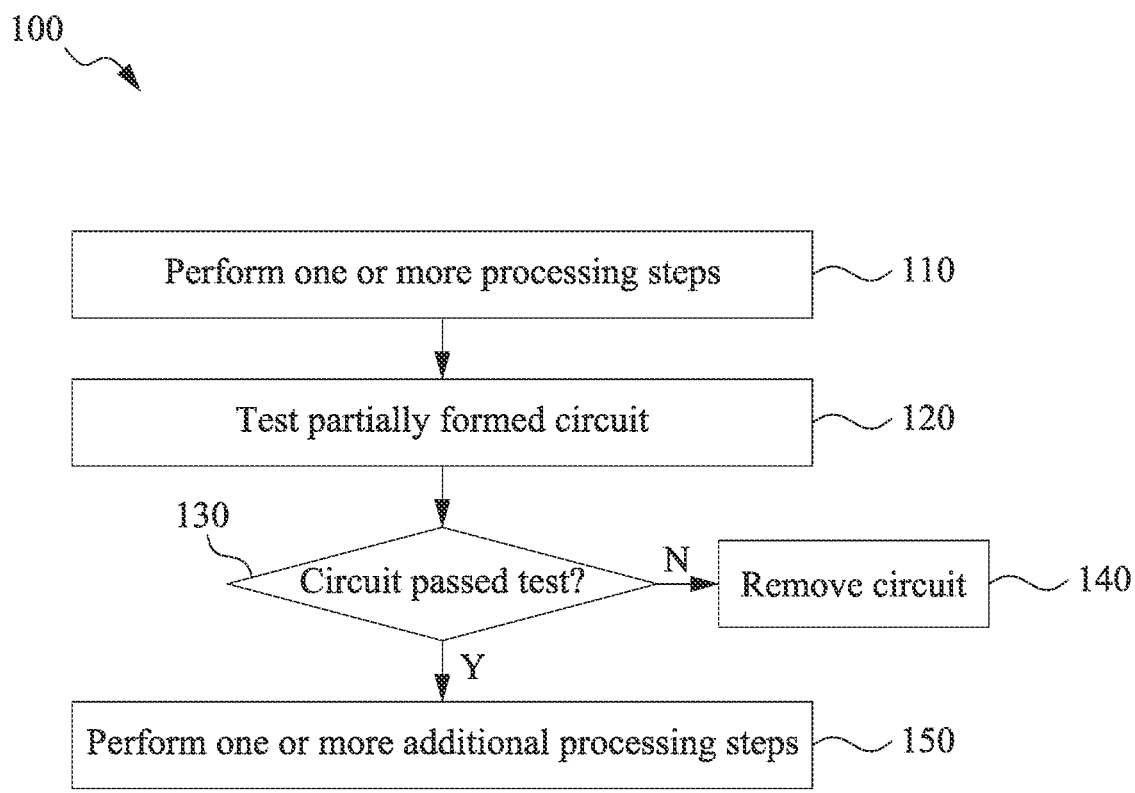
FIG. 1 illustrates a flowchart diagram illustrating a method of manufacturing a circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. As discussed in further detail below, brief description of main concepts. For example, FIGS. 1 and 2 illustrate embodiments . . .

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 2:
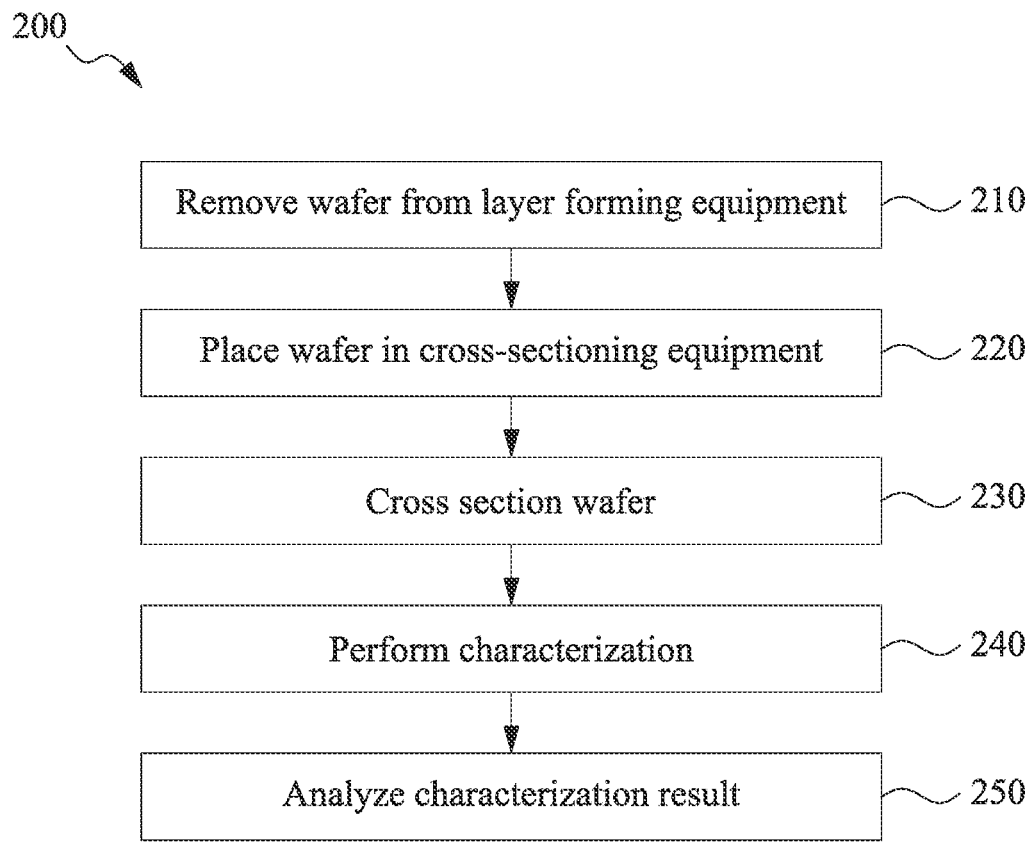
FIG. 2 illustrates a flowchart diagram illustrating a method of testing a partially formed semiconductor circuit in accordance with some embodiments.

FIG. 1 illustrates a flowchart diagram illustrating a method 100 of manufacturing a semiconductor circuit in accordance with some embodiments. As illustrated, during a manufacturing process, the semiconductor circuit is partially processed on a semiconductor wafer, and is additionally tested for compliance against manufacturing specifications. For example, when tested, the partially processed semiconductor wafer may not have yet had back end of line (BEOL) or other processes performed thereon.

At 110, semiconductor fabrication equipment performs or is caused to perform, for example, by a controller, one or more processing steps to partially form the semiconductor circuit on the semiconductor wafer. For example, one or more implant layers may be formed on or in the semiconductor wafer. In some embodiments, one or more additional layers may be formed by adding and patterning a material above or on top of the semiconductor wafer.

In some embodiments, a semiconductor wafer may be processed using one or more methods known to those of skill in the art to form one or more implant layers in the semiconductor wafer. For example, one or more species of dopant ions may be accelerated into the semiconductor wafer using an electric field. In some embodiments, after the ions are implanted into the semiconductor wafer, the semiconductor wafer is exposed to a temperature of sufficient magnitude to cause the implanted ions to defuse further or otherwise further integrate into the semiconductor wafer. In some embodiments, one or more implant layers may be formed in the semiconductor wafer using other techniques known to those of skill in the art.

In some embodiments, the semiconductor wafer may be further processed using one or more methods known to those of skill in the art to form one or more layers above or on the semiconductor wafer. For example, one or more resistive, conductive, resistive, or insulative materials may be deposited and patterned on the semiconductor wafer using, for example, photolithographic techniques known to those of skill in the art. The materials may include, for example, one or more of a conductive material, such as aluminum, a resistive material, such as polysilicon, and an insulative material, such as a silicon or hafnium oxide. Once formed, these layers may form electrical connection pathways and isolation regions between one another, and between one or more of the implant layers, as understood by those of skill in the art.

At step 120, semiconductor test equipment performs or is caused to perform, for example, by a or the controller, a test procedure on the semiconductor wafer having the semiconductor circuit partially formed thereon. For example, the test procedure may include determining one or more of geometric, electrical, and physical characteristics of one or more structures of the partially fabricated semiconductor wafer. Embodiments of various test procedures and their various aspects are discussed in further detail elsewhere herein.

In some embodiments, prior to performing the test procedure, the semiconductor wafer having the partially formed semiconductor circuit is removed from semiconductor layer generation equipment and placed into semiconductor wafer test equipment, where the semiconductor wafer test equipment is spaced apart and separate from the semiconductor layer generation equipment. In some embodiments, the semiconductor wafer is not removed from the semiconductor layer generation equipment, and the test procedure is performed in situ.

At step 130, the test equipment automatically or an operator using the test equipment determines whether the semiconductor wafer has acceptable quality to continue further processing for further fabrication of the semiconductor circuit thereon. For example, if all of the determined geometric, electrical, and physical characteristics of the structures of the partially fabricated semiconductor wafer are determined to be within acceptable ranges, the partially fabricated semiconductor wafer may be identified as having passed the test. In contrast, if one or more of the determined geometric, electrical, and physical characteristics of the structures of the partially fabricated semiconductor wafer are determined to be outside acceptable ranges, the partially fabricated semiconductor wafer may be identified as having not passed the test.

In some embodiments, one or more of the ranges is determined based on a statistical analysis of a population of previously formed layers. For example, if a measured parameter is determined to be more than any of about one, two, three, four, or five standard deviations away from the mean of the population, the semiconductor wafer may be determined to have failed the test. In some embodiments, one or more of the ranges is determined using another method.

At step 140, if the partially fabricated semiconductor wafer is identified as having not passed the test, the test or fabrication equipment, or an operator removes the partially fabricated semiconductor wafer from the fabrication process. In some embodiments, the removed semiconductor wafer is further analyzed and inspected to determine one or more additional geometric, electrical, and physical characteristics of the structures of the removed semiconductor wafer. In some embodiments, in response to determining that the partially fabricated semiconductor wafer has not passed the test, one or more pieces of semiconductor wafer fabrication equipment is inspected and/or modified, for example, by changing a processing characteristic, such as a temperature, a pressure, a material concentration, and a recipe. In some embodiments, one or more other processing characteristics may be inspected and/or modified in response to the partially fabricated semiconductor wafer having not passed the test.

Consequently, if the partially fabricated semiconductor wafer is identified as having not passed the test, the insufficient quality of the semiconductor wafer is discovered prior to performing subsequent processing steps to form additional layers. These subsequent processing steps may take, for example, several weeks. Accordingly, remedial action to improve fabrication quality may be taken weeks earlier than if the semiconductor wafer were tested after the semiconductor circuits were fully formed. Furthermore, because the semiconductor wafer is of insufficient quality, the subsequent processing steps may be of no value. Accordingly, the fabrication resources which would have been used for the subsequent processing steps may be used to form semiconductor layers which are of value on or in another semiconductor wafer.

At 150, if the partially fabricated semiconductor wafer is identified as having passed the test, the semiconductor manufacturing equipment performs one or more subsequent processing steps to further form the semiconductor circuit on the semiconductor wafer. For example, one or more implant layers may be additionally formed on or in the semiconductor wafer. In some embodiments, one or more additional layers may be formed by adding and patterning a material above or on top of the semiconductor wafer. For example, after being tested, the semiconductor wafer may not have yet had back end of line (BEOL) or other processes performed thereon.

In some embodiments, prior to performing the subsequent fabrication steps, the semiconductor wafer having the partially formed semiconductor circuit is removed from semiconductor wafer test equipment and placed into semiconductor layer generation equipment, where the semiconductor wafer test equipment is spaced apart and separate from the semiconductor layer generation equipment.

One insight provided by the inventor(s) of the present disclosure is that profiles, layers, other features or characterizations of a semiconductor wafer may be examined early in a manufacturing process before more and more layers are deposited onto the wafer as the manufacturing process progresses. Traditionally, a semiconductor wafer is tested using wafer acceptance test ("WAT") after the circuit is formed on the semiconductor wafer. For example, during "back end" processing, inter-metal ("IM") WAT may be performed. Final WAT may also be performed and each wafer that passes the final WAT is shipped out. However, one drawback of this traditional WAT testing is that if there is an in-line issue with the semiconductor wafer (which may involve an innate defect of the semiconductor wafer or may be introduced inline), finding out about this issue at WAT may be too late causing days or even weeks of delay.

In accordance with the present disclosure, a profile of a semiconductor wafer may be obtained inline, during the manufacturing process. This profile may show characteristics of different regions of the semiconductor wafer thus far fabricated. This profile can then be compared to predetermined standards for semiconductor wafers for determining whether the semiconductor wafer may have an issue.

For example, in accordance with the disclosure, a partially fabricated semiconductor wafer may be non-destructively cross-sectioned and examined using a scanning probe microscopy technique. A profile of the partially fabricated semiconductor wafer may be obtained through the scanning and this profile may be compared to a TCAD (Technology Computer-Aided Design) simulation or data from a performance data base (for example, compared with a baseline of other semiconductor wafer).

As another non-limiting example, a partially fabricated semiconductor wafer may be examined using scanning spreading resistance microscopy (SSRM) to obtain a profile. In that example, the SSRM may include an atomic force microscope (AFM) module, which may perform scanning on a cross-section of the semiconductor wafer of the wafer to measure impedance of paths including points of the cross-section contacted by a probe or to measure forces between an AFM probe and a sampled area on the cross-section. In an example implementation, a bias may be added to the SSRM for detecting electrical resistance values at different areas/regions on the cross-section. In that implementation, the bias may range from 50-5000 mV.

As mentioned above, through the semiconductor wafer profile obtaining and mapping, if the partially fabricated semiconductor wafer is deemed unacceptable or having one or more issues that may result in a defective chip(s) for a final product, measurements may be taken early during the manufacturing process. For example, a "problematic" partially fabricated semiconductor wafer may be removed from the manufacturing process altogether. This can improve a quality, efficiency, throughput, and/or any other factors of the manufacturing process.

FIG. 2 illustrates a flowchart diagram illustrating a method 200 of testing a partially formed semiconductor circuit in accordance with some embodiments. Method 200 may be used, for example, as or as part of step 120 of method 100, discussed above. Method 200 may be used as part of manufacturing processes other than that described with reference to method 100. In addition, method 100 may use methods of testing a partially formed semiconductor which are different from method 200.

At 210, an operator or an automated test or manufacturing machine removes a semiconductor wafer having, for example, a partially formed semiconductor circuit formed thereon by semiconductor layer generation equipment. For example, when removed, the partially processed semiconductor wafer may not have back end of line (BEOL) structures or other processes performed thereon.

At 220, an operator or an automated test or manufacturing machine places the semiconductor wafer into semiconductor wafer cross-sectioning equipment, where the semiconductor wafer can be at least partially cross-sectioned. In some embodiments, the semiconductor wafer cross-sectioning equipment comprises a focused ion beam (FIB) apparatus. In some embodiments, a FIB apparatus is configured to focus a fine ion beam at precise locations on the semiconductor wafer so as to ablate the semiconductor wafer at the precise locations and thereby expose a cross-section portion of the semiconductor wafer having the partially formed semiconductor circuit thereon. In some embodiments, the semiconductor wafer cross-sectioning equipment includes other devices configured to cross-section a semiconductor wafer.

At 230, the semiconductor wafer cross-sectioning equipment at least partially cross-sections the semiconductor wafer. As a result of the cross-sectioning, one or more portions of one or more semiconductor layers to be tested are exposed.

In some embodiments, the cut of the cross-section extends from a substantially planar front surface of the semiconductor wafer toward a substantially planar back surface of the semiconductor wafer. In some embodiments, the cut of the cross-section extends substantially perpendicularly from the front surface. In some embodiments, the cut of the cross-section extends from the front surface with an angle of between about +/−85 and 90, about +/−60 and 85, about +/−30 and 60, and about +/−10 and 30 degrees. In some embodiments, the cut of the cross-section extends from the front surface by another angle or angle range.

Figure 9A:
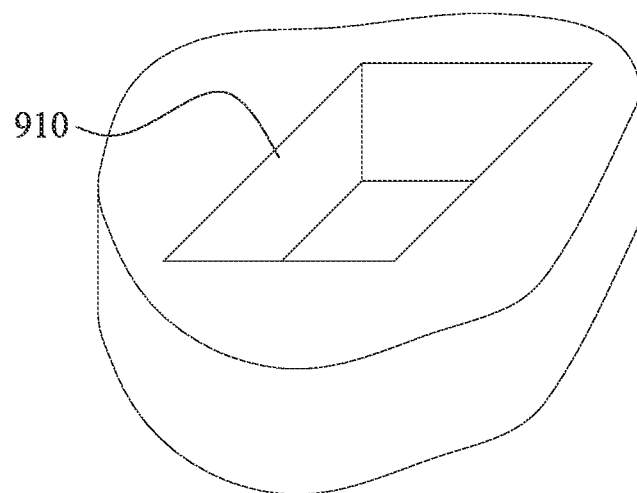
FIGS. 9A, 9B and 10 are schematic illustrations of cross-section cuts in accordance with some embodiments.
Figure 9B:
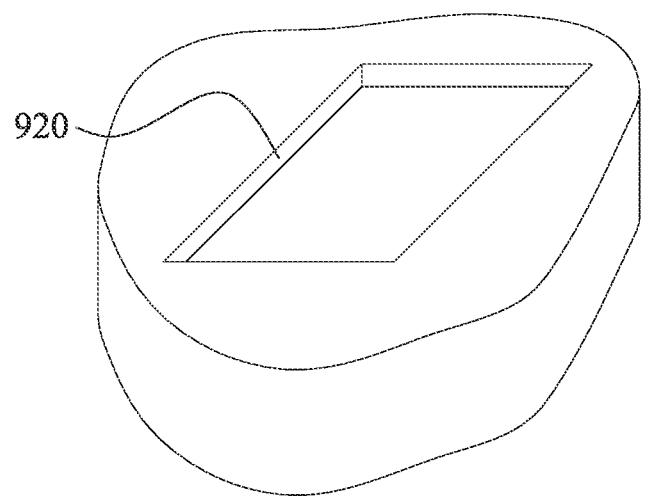

In some embodiments, the cut of the cross-section extends from the front surface of the semiconductor wafer all the way to the back surface of the semiconductor wafer. For example, as shown in FIG. 9A, cut 910 of the cross-section may extend through the semiconductor substrate, while the semiconductor substrate is exposed and not covered by another layer, such as an interlayer dielectric (ILD), at the notch portion. The back end of line (BEOL) processes may be performed on the wafer thereafter. In some embodiments, as shown in FIG. 9B, the cut 920 of the cross-section may extend from the front surface of the semiconductor wafer only partly through the semiconductor wafer. For example, the cut of the cross-section may preserve the lower portion of the semiconductor substrate, and is located, for example, in a testing line between product dies, so BEOL processes may be performed on the whole wafer thereafter.

Figure 10:
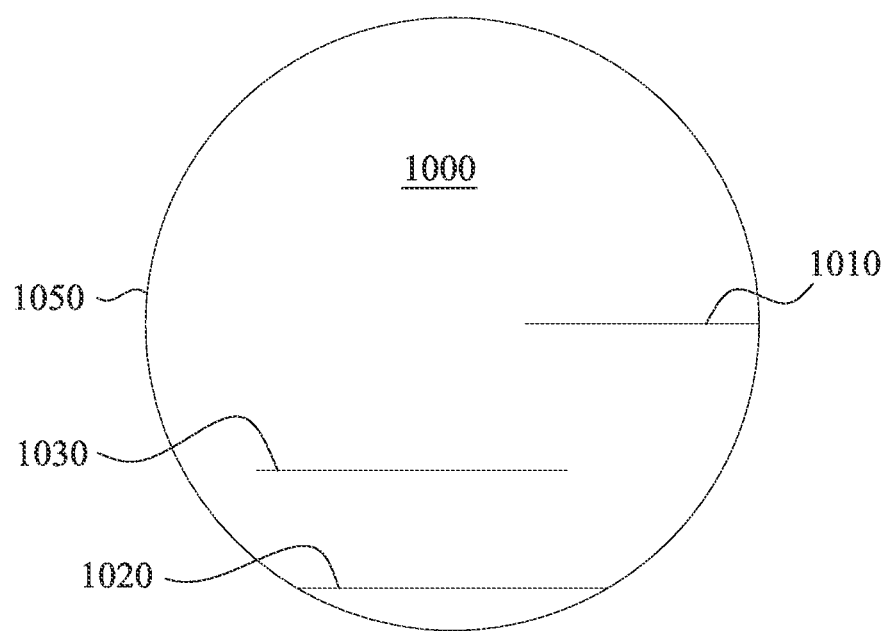

In some embodiments, as illustrated in FIG. 10 a cut 1010 of the cross-section may extend from a first point on the front surface at a peripheral edge 1050 of the semiconductor wafer 1000 to a second point on the front surface spaced apart from a nearest edge 1050. In some embodiments, as illustrated in FIG. 10 a cut 1020 of the cross-section may extend from a first point on the front surface at a peripheral edge 1050 of the semiconductor wafer 1000 to a second point on the front surface at the or another peripheral edge 1050. In some embodiments, as illustrated in FIG. 10 a cut 1030 of the cross-section may extend from a first point on the front surface spaced apart from an edge 1050 of the semiconductor wafer 1000 nearest the first point to a second point on the front surface spaced apart from an edge 1050 of the semiconductor wafer nearest the second point. In some embodiments, the cut has a length between about 1 um and about 10 um.

Figure 11A:
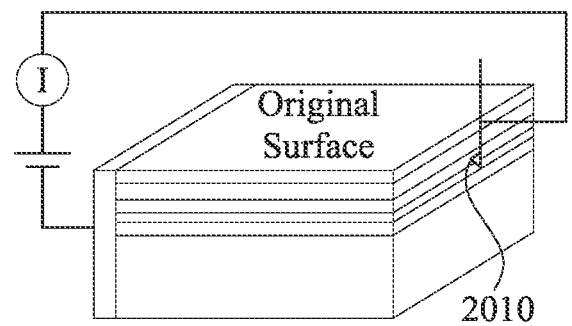
FIG. 11A is a schematic illustration of a SSRM system which may be used in accordance with some embodiments.
Figure 11B:
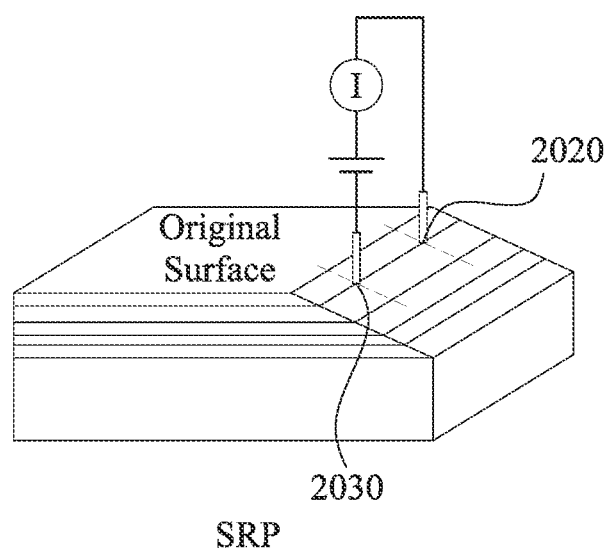
FIG. 11B is a schematic illustration of a SRP system which may be used in accordance with some embodiments.

At 240, one or more layers of the partially formed semiconductor wafer exposed by the cross-section are characterized using a characterization system. For example, when characterized, the partially processed semiconductor wafer may not have yet had back end of line (BEOL) or other processes performed thereon. Because the layers of the partially formed semiconductor wafer exposed by the cross-section may be directly tested, for example, without other additional layers between the exposed layers and the test equipment, the test results are not disturbed by any intervening layers. For example, in response to an input from an operator and/or as part of an automated software driven process, the characterization system may be configured to perform a profiling characterization, such as a Scanning Spreading Resistance Microscopy (SSRM), for example, as illustrated in FIG. 11A, or Spreading Resistance Profiling (SRP) characterization method, for example, as illustrated in FIG. 11B, which may use, for example, an Atomic Force Microscopy (AFM) or similar platform. In some embodiments, the characterization system may be configured to perform other characterization processes. It should be understood, these profiling characterization methods are provided here merely as illustration, and thus should not be interpreted that the present disclosure is limited to these profiling methods. Other profiling characterization methods are contemplated.

In some embodiments, SSRM may be advantageously used at least because vertical or substantially vertical exposed test portions (with respect to a horizontal semiconductor wafer surface) are conveniently directly contacted with a first SSRM probe 2010 (See FIG. 11A), where the vertical or substantially vertical exposed test portion may be conveniently exposed using a FIB process, as discussed elsewhere herein. In addition, SSRM may be advantageously used at least because a second probe of the SSRM system may conveniently be positioned so as to electrically connect with a contact conveniently formed in or near the test portion using the same semiconductor processing steps as those that are used to form circuit contacts.

SSRM may be advantageously used at least because the probe contact may have a size in the range of about 8 nm to about 12 nm. In some embodiments, the probe contact may have a size equal to about 10 nm. SSRM may be advantageously used at least because the first and second probes may be separated by a distance between about 10 um and about 2 mm.

In some embodiments, SRP is advantageously used at least because SRP may use two probes 2020 and 2030, for example, separated by a distance of about 15 um, to directly contact a single surface, which may, for example, be beveled with respect to the top surface of the semiconductor wafer, as illustrated in FIG. 11B. SRP may be advantageously used at least because the probe contacts may have a size in the range of about 1.8 um to about 2.2 um. In some embodiments, the probe contacts may have a size equal to about 2 um.

Scanning probe microscopy is an umbrella term that covers several scanning techniques to diagnose semiconductor chips, such as, conducting atomic force microscopy, scanning spreading resistance microscopy, scanning capacitance microscopy and scanning tunneling microscopy. In accordance with the present disclosure, in some embodiments, scanning probe microscopy is performed before the circuit on the semiconductor wafer is fully fabricated.

In some embodiments, the characterization system generates a two-dimensional map or representation of a portion of the cross-section, where the two-dimensional map or representation provides an indication of the composition of each of a number of points on the portion. For example, the characterization system may generate a two dimensional map or representation indicating an electrical resistance of each point of the map, where each point of the map corresponds with a point on the cross-section.

In some embodiments, the characterization system generates a two-dimensional map or representation of a front or top portion of the partially fabricated semiconductor wafer, where the front or top portion of the partially fabricated semiconductor wafer is exposed without a cross-sectioning operation, and where the two-dimensional map or representation provides an indication of the composition of each of a number of points on the front or top portion. For example, the characterization system may generate a two dimensional map or representation indicating an electrical resistance of each point of the map, where each point of the map corresponds with a point on the cross-section.

In some embodiments, the semiconductor wafer is not placed in cross-sectioning equipment, and is not cross-sectioned prior to characterization. Instead, a portion of the semiconductor wafer already exposed may be characterized using the techniques discussed herein.

At 250, an operator and/or an automated analysis machine analyzes the two-dimensional map or representation of the cross-section to determine whether the previously performed fabrication processing steps have properly formed one or more layers of the characterized cross-section. For example, one or more previously formed layers or boundaries between layers represented in the two-dimensional map or representation may be analyzed to determine compliance with specified values or ranges.

For example, one or more parameters may be measured or otherwise determined and compared with a specification to determine whether the semiconductor wafer complies with manufacturing specifications. For example, one or more widths, one or more depths, one or more thicknesses, and one or more positions of one or more boundaries of one or more layers may be measured and compared with a specification minimum limit, maximum limit, allowable range limit, unallowable range limit, or another limit. In some embodiments, spacing between one or more layers may be measured and compared with a specification to determine whether the semiconductor wafer complies with specifications. In some embodiments, a parameter measured by the characterization system, such as impedance, is compared with a specification limit to determine compliance.

In some embodiments, one or more first parameters of a particular test or circuit portion located at a first position on the semiconductor wafer is measured and compared with one or more corresponding second parameters of one or more additional test or circuit portions located at a one or more additional positions on the semiconductor wafer. In these embodiments, parameters compared with a limit may include a maximum difference, an average, a standard deviation, or another statistical parameter among the distribution of measured parameters.

In some embodiments, an operator interfaces with a computer having a processor, a memory, and a graphical user interface (GUI) to determine whether the semiconductor wafer complies with manufacturing specifications. For example, the processor may run software including instructions to cause the processor, in response to commands from the operator, to generate graphical representations of one or more rulers or markers on a graphically displayed image of the two-dimensional map or representation of the cross-section generated by the characterization system.

Using the graphical representations of the rulers or markers, the operator may quantize a particular parameter to generate a measurement value. The operator, the computer, or another computational system may compare the measurement value to one or more appropriate specification ranges to determine whether the semiconductor wafer complies with the manufacturing specifications.

In some embodiments, a computer having a processor, a memory, and a graphical user interface (GUI) automatically determines whether the semiconductor wafer complies with manufacturing specifications. For example, the processor may run software including instructions to cause the processor to quantize each particular parameter to generate a measurement value. The computer, or another computational system may compare the measurement value to one or more appropriate specification ranges to determine whether the semiconductor wafer complies with the manufacturing specifications.

Figure 3A:
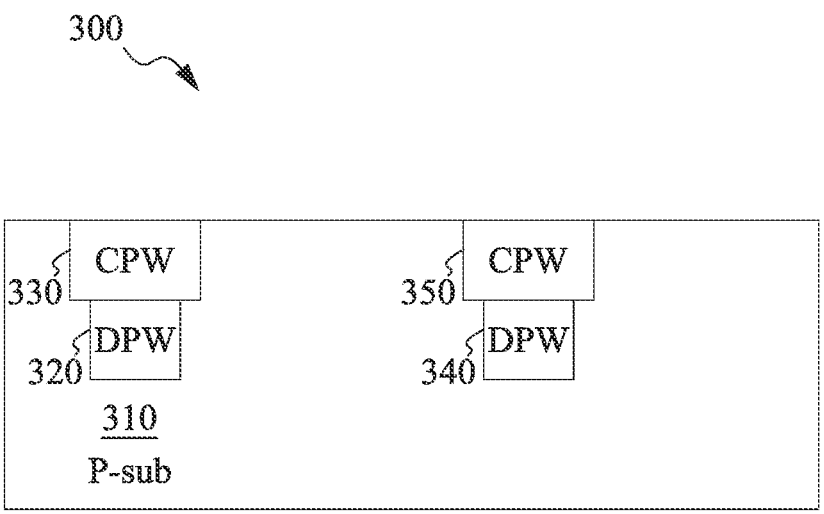
FIG. 3A illustrates a schematic cross-section view of a partially formed semiconductor circuit prior to undergoing a testing procedure in accordance with some embodiments.

FIG. 3A illustrates a schematic cross-section view of a portion of a semiconductor wafer 300 having a partially formed semiconductor circuit formed thereon prior to undergoing a testing procedure in accordance with some embodiments. The illustrated embodiment has particular structures formed in the illustrated layers. In some embodiments, other structures are formed in the illustrated and/or other layers.

As illustrated, the partially formed semiconductor circuit formed on semiconductor wafer 300 includes deep P-well portions 320 and 340 and cell P-well portions 330 and 350 formed on a P-type substrate 310. In some other embodiments, other layers are also included.

In some embodiments, the partially formed semiconductor circuit includes one or more structures or layers, which, when combined with other structures or layers, if subsequently fabricated, constitute a completely formed semiconductor circuit. In some embodiments, the completely formed semiconductor circuit includes a pixel circuit, having, for example, one or more transistors, and one or more diodes. In some embodiments, the completely formed semiconductor circuit includes one or more of: a digital logic circuit having a number of transistors and conductive elements electrically connecting the transistors; and analog circuitry having, for example, a number of transistors, resistors, capacitors, diodes, and conductive elements electrically connecting the transistors, resistors, capacitors, and diodes.

Semiconductor wafer 300 may be manufactured according to embodiments of method 100 of FIG. 1. For example, after deep P-well portions 320 and 340, and cell P-well portions 330 and 350 are formed, semiconductor wafer 300 may be cross-sectioned and tested according to, for example, method 200 of FIG. 2. For example, one or more parameters of either or both of deep P-well portions 320 and 340, and cell P-well portions 330 and 350 may be cross-sectioned and tested. Furthermore, once the semiconductor wafer 300 is determined to have passed the test of method 200, subsequent fabrication processing steps may be performed to generate subsequent layers toward forming the semiconductor circuit to be formed thereon.

Figure 3B:
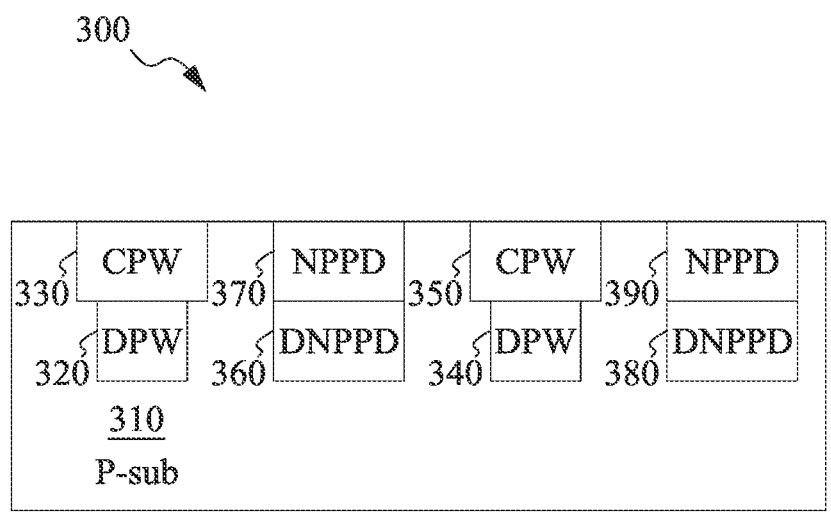
FIG. 3B illustrates a schematic cross-section view of the semiconductor circuit of FIG. 3A after undergoing a testing procedure and after further processing in accordance with some embodiments.

FIG. 3B illustrates a schematic cross-section view of a portion of semiconductor wafer 300 having a partially formed semiconductor circuit with subsequent layers formed thereon after undergoing the testing procedure in accordance with some embodiments. The illustrated embodiment has particular structures formed in the illustrated layers. In some embodiments, other structures are formed in the illustrated and/or other layers.

As illustrated, the partially formed semiconductor circuit formed on semiconductor wafer 300 continues to include deep P-well portions 320 and 340 and cell P-well portions 330 and 350. In this example, the partially formed semiconductor circuit includes deep N-type pinned photodiode (DNPPD) implant portions 360 and 380, and N-type pinned photodiode (NPPD) implant portions 370 and 390, which have been formed on the P-type substrate 310 as a consequence of the semiconductor wafer 300 having passed the test. In some embodiments, other layers are also included.

In some embodiments, a cross-section cut is made so as to form a horizontal plane in the semiconductor wafer 300 as seen in FIGS. 3A and 3B, and one or more test features cross-section cut are tested.

In some embodiments, one or more test features of semiconductor wafer 300 are tested, which are not exposed by a cutting operation. For example, test features on an upper surface of semiconductor wafer 300, as illustrated in FIGS. 3A and 3B may be tested in some embodiments.

Figure 4A:
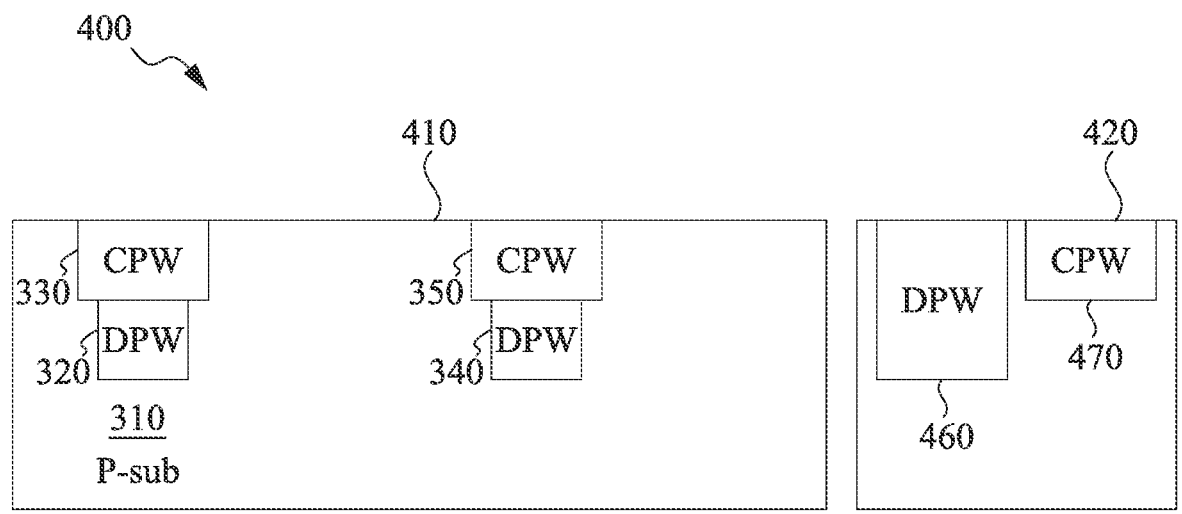
FIG. 4A illustrates a schematic cross-section view of a partially formed semiconductor circuit and a partially formed test circuit prior to undergoing a testing procedure in accordance with some embodiments.

FIG. 4A illustrates a schematic cross-section view of a portion of a semiconductor wafer 400 having a partially formed semiconductor circuit formed thereon prior to undergoing a testing procedure in accordance with some embodiments. The illustrated embodiment has particular circuit and test structures formed in the illustrated layers. In some embodiments, other circuit and test structures are formed in the illustrated and/or other layers. The test structures may for example, have an implant depth of between about 1 um and about 5 um. Other depths may be used. In some embodiments, an implant depth of one or more test structures is between about 1 um and about 5 um and is independent as an implant depth of a corresponding circuit structure of the same implant layer. In some embodiments, an implant depth of one or more test structures is the same or about the same as an implant depth of a corresponding circuit structure of the same implant layer.

As illustrated, the partially formed semiconductor circuit formed on semiconductor wafer 400 includes a circuit portion 410 having deep P-well portions 320 and 340 and cell P-well portions 330 and 350 formed on P-type substrate 310. In addition, the semiconductor wafer 400 includes a test portion 420, which is spaced apart from circuit portion 410 and includes deep P-well test structure 460 and cell P-well test structure 470. In some embodiments, other layers are also included in either or both of the circuit portion 410 and the test portion 420. The cross-section of test portion 420 illustrated in FIG. 4A may have been exposed through a cross sectioning process, such as that discussed with reference to 230 of FIG. 2.

Semiconductor wafer 400 may be manufactured according to embodiments of method 100 of FIG. 1. For example, deep P-well portions 320 and 340 and deep P-well test structure 460 may be simultaneously formed during the manufacturing process. Deep P-well test structure 460 may be formed specifically as a test structure. For example, deep P-well test structure 460 may be sized so that it has features to be tested which are easily accessed during the testing procedure. For example, deep P-well test structure 460 may be wider than deep P-well portions 320 and 340. In some embodiments, deep P-well test structure 460 may be at least 1 micron wide, as viewed from the perspective illustrated in FIG. 4A. For example, deep P-well test structure 460 may be between about 1 um and about 2 um wide. In some embodiments, deep P-well test structure 460 may be spaced apart from other layers so as to be substantially isolated, such that access during testing is improved.

Similarly, cell P-well portions 330 and 350 and cell P-well test structure 470 may also be simultaneously formed during the manufacturing process. Cell P-well test structure 470 may be formed specifically as a test structure. For example, cell P-well test structure 470 may be sized so that it has features to be tested which are easily accessed during the testing procedure. For example, cell P-well test structure 470 may be wider than cell P-well portions 330 and 350. In some embodiments, cell P-well test structure 470 may be at least 1 micron wide, as viewed from the perspective illustrated in FIG. 4A. For example, cell P-well test structure 470 may be between about 1 um and about 2 um wide. In some embodiments, cell P-well test structure 470 may be spaced apart from other layers so as to be substantially isolated, such that access during testing is improved.

Accordingly, in some embodiments, as test structures, deep P-well test structure 460 and the cell P-well test structure 470 are formed for testing the performance of the manufacturing process, as described herein, and are not formed as a portion of a functional circuit which processes signals. For example, while deep P-well portions 320 and 340 and cell P-well portions 330 and 350 are formed so as to cooperatively function with other layers to perform, for example, a signal processing operation, each of deep P-well test structure 460 and the cell P-well test structure 470 are formed for testing.

The test portion 420 may be cross-sectioned according to, for example, 230 of method 200 to expose the deep P-well test structure 460 and the cell P-well test structure 470. In some embodiments, the circuit portion 410 is not cross-sectioned and not tested. After cross-sectioning, either or both of the P-well test structure 460 and the cell P-well test structure 470, either or both of the P-well test structure 460 and the cell P-well test structure 470 may be tested according to, for example, 240 and 250 of method 200 of FIG. 2. For example, one or more parameters of either or both of deep P-well test structure 460 and cell P-well test structure 470 may be tested. Furthermore, once the semiconductor wafer 400 is determined to have passed the test of method 200, subsequent fabrication processing steps may be performed to generate additional layers toward forming the semiconductor circuit to be formed thereon.

Figure 4B:
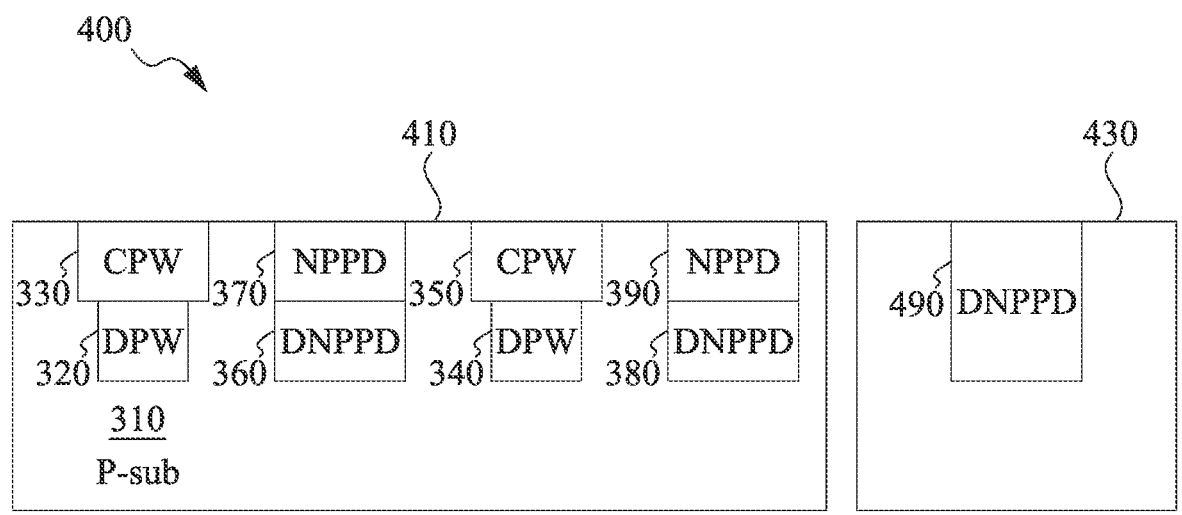
FIG. 4B illustrates a schematic cross-section view of the semiconductor circuit and test circuit of FIG. 4A after undergoing a testing procedure and after further processing in accordance with some embodiments.

FIG. 4B illustrates a schematic cross-section view of a portion of semiconductor wafer 400 having a partially formed semiconductor circuit with additional layers formed thereon after undergoing the testing procedure in accordance with some embodiments. As illustrated, the partially formed semiconductor circuit formed on semiconductor wafer 400 continues to include deep P-well portions 320 and 340 and cell P-well portions 330 and 350. Semiconductor wafer 400 also continues to include test portion 420 which is exposed because of cross-sectioning, although test portion 420 is not illustrated in FIG. 4B. The circuit portion 410 additionally includes deep N-type pinned photodiode (DNPPD) implant portions 360 and 380, and N-type pinned photodiode (NPPD) implant portions 370 and 390, which have been formed on the P-type substrate 310 as a consequence of the semiconductor wafer 400 having passed the test. Semiconductor wafer 400 also includes a test portion 430, which is spaced apart from test portion 420 and circuit portion 410 and includes deep N-type pinned photodiode (DNPPD) test structure 490, which may be used for further testing prior to further layer formation of the semiconductor circuit. Test structure 490 may be tested, for example, according to one or more aspects of the methods described herein. In some embodiments, other layers are also included. The cross-section of test portion 430 illustrated in FIG. 4B may have been exposed through a cross sectioning process, such as that discussed with reference to 230 of FIG. 2.

In some embodiments, a first cross-section cut exposes the P-well test structure 460 and the cell P-well test structure 470, and a second cross-section cut exposes test structure 490. In some embodiments, the first and second cross-section cuts do not intersect. In some embodiments, the first cross-section cut does not expose test structure 490. In some embodiments, the second cross-section cut does not expose the P-well test structure 460 or the cell P-well test structure 470.

In some embodiments, a cross-section cut is made so as to form a horizontal plane in the test portion 420 as seen in FIGS. 4A and 4B, and one or more test features of test portion 420 are tested.

In some embodiments, one or more test features of test portion 420 are tested, which are not exposed by a cutting operation. For example, test features on an upper surface of test portion 420 and/or test portion 430, as illustrated in FIGS. 4A and 4B may be tested.

Figure 5:
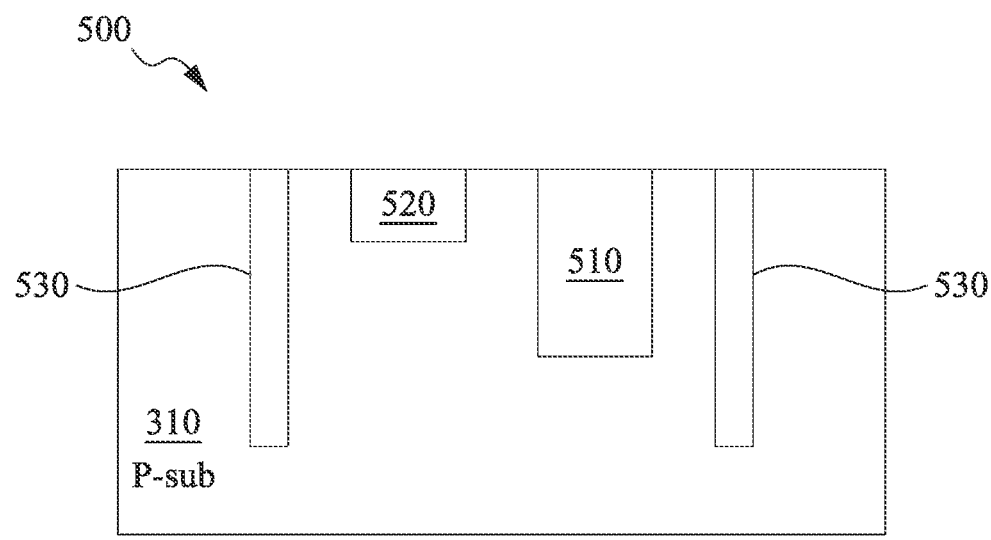
FIG. 5 illustrates a schematic cross-section view of a partially formed semiconductor and/or test circuit in accordance with some embodiments.

FIG. 5 illustrates a schematic cross-section view of a portion of a semiconductor wafer 500 having a partially formed test circuit 510 in accordance with some embodiments. Test circuit 510 may have features similar or identical to the structures formed in circuit portions of semiconductor wafers discussed herein, such as circuit portion 410 discussed with reference to FIG. 4A. In some embodiments, test circuit 510 may have features similar or identical to the structures formed in test portions of semiconductor wafers discussed herein, such as test portion 420 discussed with reference to FIG. 4A. In some embodiments, other layers are also included in test circuit 510. The cross-section of partially formed test circuit 510 illustrated in FIG. 5 may have been exposed through a cross sectioning process, such as that discussed with reference to 230 of FIG. 2.

Semiconductor wafer 500 also includes a substrate contact 520. In some embodiments of test procedures, an electrical connection to the substrate 310 is used to provide a current conduction path for a first probe of the test equipment. A second probe of the test equipment is used to contact various points along the exposed cross-section. A voltage is generated across the first and second probes by the test equipment, and current conducted between the first and second probes is measured. Thereby, an impedance may be measured or calculated and associated with each contact point of the second probe to form a two-dimensional map or other representation of the exposed cross-section.

Semiconductor wafer 500 may be manufactured according to embodiments of method 100 of FIG. 1. The test circuit 510 may be cross-sectioned according to, for example, 230 of method 200 to expose the testable features of test circuit 510. In some embodiments, semiconductor wafer 500 additionally includes a circuit portion (not shown) that is not cross-sectioned. After test circuit 510 is cross-sectioned, test circuit 510 may be tested according to, for example, 240 and 250 of method 200 of FIG. 2. While test circuit 510 is tested, substrate contact 520 may provide a current conduction path for a probe of the test equipment, as discussed above. For example, one or more parameters of test circuit 510 may be tested. Furthermore, once the semiconductor wafer 500 is determined to have passed the test of method 200, subsequent fabrication processing steps may be performed to generate additional layers toward forming the semiconductor circuit to be formed thereon.

Substrate contact 520 may include one or more conductive implant layers. In some embodiments, substrate contact 520 additionally includes a conductive metallization layer. In some embodiments, substrate contact 520 is partially or entirely formed using the same semiconductor manufacturing equipment and at the same time as one or more circuit structures are formed on or in wafer 500. In some embodiments, substrate contact 520 is partially or entirely formed using a focused ion beam process.

Semiconductor wafer 500 also includes an isolation structure 530 surrounding substrate contact 520 and test circuit 510. Isolation structure 530 is configured to provide electrical isolation to the substrate contact and the test circuit 510 so that, during testing, electrical interference from structures outside the test circuit 510 have reduced or no influence on the test results. For example, free electrons or holes have reduced or no influence on the test results because of isolation structure 530.

Isolation structure 530 may be formed, for example, using any isolation structure known to those of skill in the art. For example, isolation structure 530 may include one or more of an implant, an oxide, or a trench. In some embodiments, isolation structure 530 is electrically nonconductive. In some embodiments, isolation structure 530 is electrically conductive, and, during the test procedure is grounded or charged to some other DC voltage.

Figure 6:
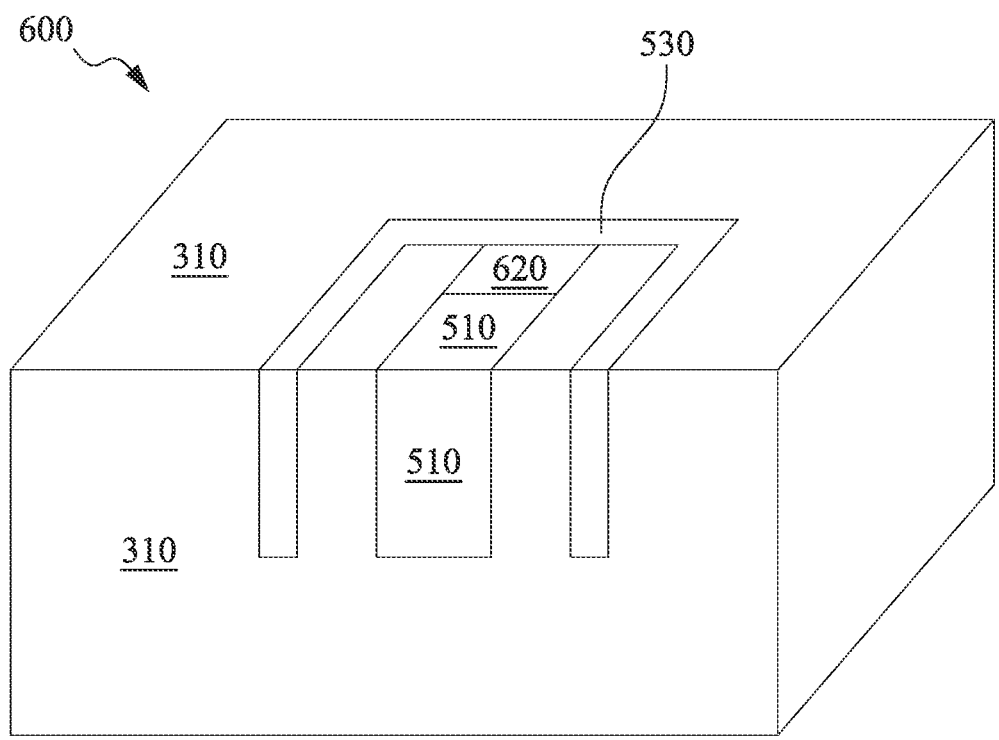
FIG. 6 illustrates a schematic cross-section view of a partially formed semiconductor and/or test circuit in accordance with some embodiments.

FIG. 6 illustrates a schematic cross-section view of a portion of a semiconductor wafer 600 having a partially formed test circuit 510 in accordance with some embodiments. Semiconductor wafer 600 also includes a substrate contact 620. Semiconductor wafer 600 may be manufactured according to embodiments of method 100 of FIG. 1. The cross-section of partially formed test circuit 510 illustrated in FIG. 6 may have been exposed through a cross sectioning process, such as that discussed with reference to 230 of FIG. 2.

Substrate contact 620 may include one or more conductive implant layers. In some embodiments, substrate contact 620 additionally includes a conductive metallization layer. In some embodiments, substrate contact 620 extends from a front or top surface of semiconductor wafer 600, which is not covered by an ILD, all the way to an opposing back or bottom surface of semiconductor wafer 600. In some embodiments, substrate contact 620 is partially or entirely formed using the same semiconductor manufacturing equipment and at the same time as one or more circuit structures are formed on or in wafer 600. In some embodiments, substrate contact 620 is partially or entirely formed using a focused ion beam process.

In some embodiments, substrate contact 620 directly contacts one or more layers or structures of test circuit 510. As a result, during the test procedure, impedance measurements are made based primarily or substantially entirely on the impedance of the substrate contact 620 and one or more layers or structures of the test circuit 510.

Semiconductor wafer 600 also includes an isolation structure 530 surrounding substrate contact 620 and test circuit 510. Isolation structure 530 is configured to provide electrical isolation to the substrate contact 620 and the test circuit 510, for example, as discussed elsewhere herein.

Figure 7:
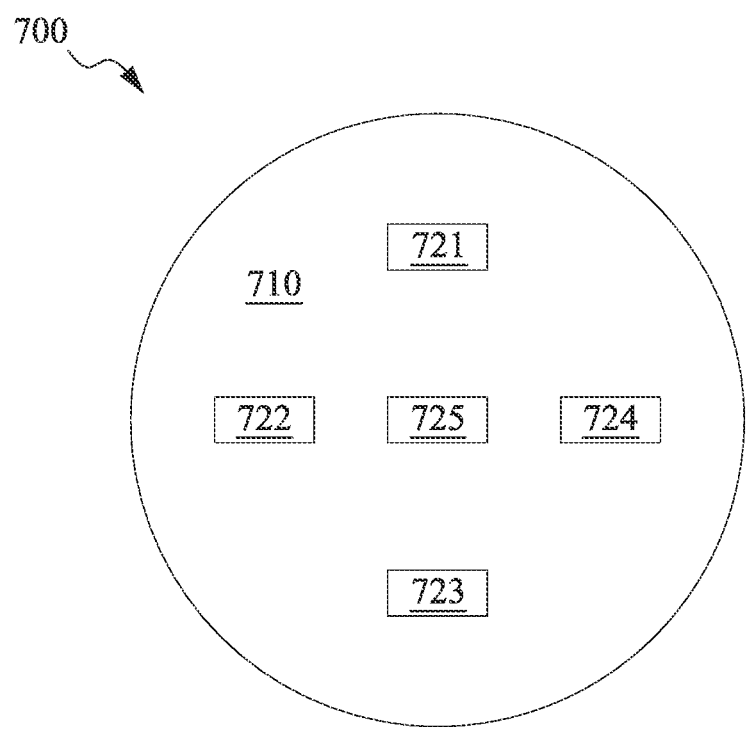
FIG. 7 illustrates a schematic view of a semiconductor wafer in accordance with some embodiments.

FIG. 7 illustrates a schematic cross-section view of a semiconductor wafer 700 in accordance with some embodiments. Semiconductor wafer 700 includes circuit area 710 and test portions 721, 722, 723, 724, and 725.

Circuit area 710 includes a number of partially or completely formed semiconductor circuits, each forming or partially forming a functional electrical circuit, for example having features similar or identical to those of the circuit portions of semiconductor wafers discussed herein. After completion, the semiconductor circuits may include electrical connection pads or terminals which may be contacted, for example by test equipment, to perform electrical operation tests on the semiconductor circuits. The semiconductor circuits may be spaced apart from one another so that they may be separated in a dicing operation to form a number of semiconductor circuit die, each having one or more functional semiconductor circuits formed there on. In some embodiments, the methods discussed herein include testing the semiconductor circuits. In some embodiments, the methods discussed herein include physically separating the semiconductor circuits from one another using, for example, a dicing operation. In some embodiments, the methods discussed herein include packaging the semiconductor circuit die in an integrated circuit package.

Each of test portions 721, 722, 723, 724, and 725 may have features similar or identical to those of the test portions of the semiconductor wafers discussed herein. Each of test portions 721, 722, 723, 724, and 725 may have features similar or identical to those of the circuit portions of the semiconductor wafers discussed herein or other product dies formed on the semiconductor wafer. In some embodiments, each of test portions 721, 722, 723, 724, and 725 has similar or identical tests structures and features as those on the others of test portions 721, 722, 723, 724, and 725. In some embodiments, each of test portions 721, 722, 723, 724, and 725 has one or more tests structures and features which are different from those of the others of test portions 721, 722, 723, 724, and 725. In some embodiments, the test portions 721, 722, 723, 724, and 725 may be disposed in a notch or a test line. In some embodiments, the test portions 721, 722, 723, 724, and 725 may have depth from about 1 micron to 5 microns, while the implantation area of a product device has a side width from about 1 micron to 10 microns and a length from about 10 microns to 2 mm.

In some embodiments, a first subset of test portions 721, 722, 723, 724, and 725 is cross-sectioned and tested after a first one or more layers are formed in or on semiconductor wafer 700 and before a second one or more layers are formed in or on semiconductor wafer 700, and a second, different, subset of test portions 721, 722, 723, 724, and 725 is cross-sectioned and tested after the second one or more layers are formed in or on semiconductor wafer 700.

FIG. 8 illustrates a schematic view of a semiconductor circuit manufacturing process 800 in accordance with some embodiments. Process 800 includes various layer formation steps 802-846, which may each include a number of steps to form one or more semiconductor layers. Various steps of process 800 may be used, for example, to form the semiconductor layers of circuit portions and test portions on a semiconductor wafer, such as those illustrated in FIGS. 3A, 3B, 4A, 4B, 5, and 6. In some embodiments, the steps of process 800 are used to form other structures, not illustrated. In some embodiments, process 800 includes other steps not specifically described herein to form semiconductor layers of circuit portions and test portions on a semiconductor wafer. In some embodiments, one or more described steps are omitted.

In some embodiments, method 100 of FIG. 1 is used with manufacturing process 800. For example, the processing steps performed at 110 of method 100 may include one or more of the various layer formation steps 802-844 of semiconductor circuit manufacturing process 800. In some embodiments, the processing steps performed at 150 of method 100 may include one or more of the various layer formation steps 804-846 of semiconductor circuit manufacturing process 800.

In some embodiments, method 100 is used with other manufacturing processes having one or more of steps 802-848 omitted and/or one or more additional steps added. In some embodiments, methods having one or more steps omitted from and/or added to method 100 are used with manufacturing process 800. All such combinations and variations are contemplated.

At step 802 OD, oxide generation steps are performed to generate one or more oxide layers in areas of the semiconductor wafer which are not going to subsequently receive an active area implant, such as source and drain diffusion areas. In some embodiments, step 802 is also used to generate a test structure which may be located in a test portion of the semiconductor wafer. The test structure may include features which may be tested using techniques discussed herein to test a result or performance of step 802. Techniques known to those of skill in the art are used to perform step 802.

In some embodiments, after step 802 and before step 804, method 800 includes features or actions similar or identical to those discussed above with reference to steps 120, 130, and 140 of FIG. 1.

At step 804 FLD, a field well implant is performed at least to repair any implant damage previously incurred, and to reduce or eliminate defects in the isolation structure 530 to reduce or eliminate defect induced leakage in the isolation structure 530. In some embodiments, step 804 is also used to generate a test structure which may be located in a test portion of the semiconductor wafer. The test structure may include features which may be tested using techniques discussed herein to test a result or performance of step 804. Techniques known to those of skill in the art are used to perform 804.

In some embodiments, after step 804 and before step 806, method 800 includes features or actions similar or identical to those discussed above with reference to steps 120, 130, and 140 of FIG. 1.

At step 806 Logic, implant steps are performed to generate one or more implant layers for digital logic circuitry. In some embodiments, step 806 is also used to generate a test structure which may be located in a test portion of the semiconductor wafer. The test structure may include features which may be tested using techniques discussed herein to test a result or performance of step 806. Techniques known to those of skill in the art are used to perform step 806.

In some embodiments, after step 806 and before step 808, method 800 includes features or actions similar or identical to those discussed above with reference to steps 120, 130, and 140 of FIG. 1.

At step 808 DPW, implant steps are performed to generate one or more deep P-well layers. In some embodiments, step 808 is also used to generate a test structure which may be located in a test portion of the semiconductor wafer. The test structure may include features which may be tested using techniques discussed herein to test a result or performance of step 808. Techniques known to those of skill in the art are used to perform step 808.

In some embodiments, after step 808 and before step 810, method 800 includes features or actions similar or identical to those discussed above with reference to steps 120, 130, and 140 of FIG. 1.

At step 810 CPW, implant steps are performed to generate one or more shallower cell P-well layers. In some embodiments, step 810 is also used to generate a test structure which may be located in a test portion of the semiconductor wafer. The test structure may include features which may be tested using techniques discussed herein to test a result or performance of step 810. Techniques known to those of skill in the art are used to perform step 810.

In some embodiments, after step 810 and before step 812, method 800 includes features or actions similar or identical to those discussed above with reference to steps 120, 130, and 140 of FIG. 1.

At step 812 DNPPD, implant steps are performed to generate one or more deep N implant layers for pinned photo diodes. In some embodiments, step 812 is also used to generate a test structure which may be located in a test portion of the semiconductor wafer. The test structure may include features which may be tested using techniques discussed herein to test a result or performance of step 812. Techniques known to those of skill in the art are used to perform step 812.

In some embodiments, after step 812 and before step 818, method 800 includes features or actions similar or identical to those discussed above with reference to steps 120, 130, and 140 of FIG. 1.

At step 818 GATE OX, oxide generation steps are performed to generate one or more gate oxide layers. In some embodiments, step 818 is also used to generate a test structure which may be located in a test portion of the semiconductor wafer. The test structure may include features which may be tested using techniques discussed herein to test a result or performance of step 818. Techniques known to those of skill in the art are used to perform step 818.

In some embodiments, after step 818 and before step 820, method 800 includes features or actions similar or identical to those discussed above with reference to steps 120, 130, and 140 of FIG. 1.

At step 820 PO PH, a poly photolithography operation is performed to define poly gate areas for device ON/OFF control. In some embodiments, step 820 is also used to generate a test structure which may be located in a test portion of the semiconductor wafer. The test structure may include features which may be tested using techniques discussed herein to test a result or performance of step 820. Techniques known to those of skill in the art are used to perform step 820.

In some embodiments, after step 820 and before step 822, method 800 includes features or actions similar or identical to those discussed above with reference to steps 120, 130, and 140 of FIG. 1.

At step 822 NPPD, implant steps are performed to generate one or more N implant layers for pinned photo diodes. In some embodiments, step 822 is also used to generate a test structure which may be located in a test portion of the semiconductor wafer. The test structure may include features which may be tested using techniques discussed herein to test a result or performance of step 822. Techniques known to those of skill in the art are used to perform step 822.

In some embodiments, after step 822 and before step 824, method 800 includes features or actions similar or identical to those discussed above with reference to steps 120, 130, and 140 of FIG. 1.

At step 824 POHM RM, a poly hard mask, for example, defining an area for under poly implant and post implant is removed. In some embodiments, step 824 is also used to generate a test structure which may be located in a test portion of the semiconductor wafer. The test structure may include features which may be tested using techniques discussed herein to test a result or performance of step 824. Techniques known to those of skill in the art are used to perform step 824.

In some embodiments, after step 824 and before step 826, method 800 includes features or actions similar or identical to those discussed above with reference to steps 120, 130, and 140 of FIG. 1.

At step 826 Logic LDD, implant steps are performed to generate one or more lightly doped drain layers. In some embodiments, step 826 is also used to generate a test structure which may be located in a test portion of the semiconductor wafer. The test structure may include features which may be tested using techniques discussed herein to test a result or performance of step 826. Techniques known to those of skill in the art are used to perform step 826.

In some embodiments, after step 826 and before step 830, method 800 includes features or actions similar or identical to those discussed above with reference to steps 120, 130, and 140 of FIG. 1.

At step 830 PPPD, implant steps are performed to generate one or more P implant layers for pinned photo diodes. In some embodiments, step 830 is also used to generate a test structure which may be located in a test portion of the semiconductor wafer. The test structure may include features which may be tested using techniques discussed herein to test a result or performance of step 830. Techniques known to those of skill in the art are used to perform step 830.

In some embodiments, after step 830 and before step 832, method 800 includes features or actions similar or identical to those discussed above with reference to steps 120, 130, and 140 of FIG. 1.

At step 832 SW, a spacer is defined to protect polysilicon, or the like, by depositing an oxide film. In some embodiments, step 832 is also used to generate a test structure which may be located in a test portion of the semiconductor wafer. The test structure may include features which may be tested using techniques discussed herein to test a result or performance of step 832. Techniques known to those of skill in the art are used to perform step 832.

In some embodiments, after step 832 and before step 836, method 800 includes features or actions similar or identical to those discussed above with reference to steps 120, 130, and 140 of FIG. 1.

At step 836 N+S/D, implant steps are performed to generate one or more N implant layers for sources and drains of N type transistors. In some embodiments, step 836 is also used to generate a test structure which may be located in a test portion of the semiconductor wafer. The test structure may include features which may be tested using techniques discussed herein to test a result or performance of step 836. Techniques known to those of skill in the art are used to step perform step 836.

In some embodiments, after step 836 and before step 838, method 800 includes features or actions similar or identical to those discussed above with reference to steps 120, 130, and 140 of FIG. 1.

At step 838 P+S/D, implant steps are performed to generate one or more P implant layers for sources and drains of P type transistors. In some embodiments, step 838 is also used to generate a test structure which may be located in a test portion of the semiconductor wafer. The test structure may include features which may be tested using techniques discussed herein to test a result or performance of step 838. Techniques known to those of skill in the art are used to perform step 838.

In some embodiments, after step 838 and before step 840, method 800 includes features or actions similar or identical to those discussed above with reference to steps 120, 130, and 140 of FIG. 1.

At step 840 PPPD, implant steps are performed to generate one or more P implant layers for pinned photo diodes. In some embodiments, step 840 is also used to generate a test structure which may be located in a test portion of the semiconductor wafer. The test structure may include features which may be tested using techniques discussed herein to test a result or performance of step 840. Techniques known to those of skill in the art are used to perform step 840.

In some embodiments, after step 840 and before step 842, method 800 includes features or actions similar or identical to those discussed above with reference to steps 120, 130, and 140 of FIG. 1.

At step 842 RPO, deposition steps are performed to generate one or more resist protection layers, such as one or more resist protection oxide layers. In some embodiments, step 842 is also used to generate a test structure which may be located in a test portion of the semiconductor wafer. The test structure may include features which may be tested using techniques discussed herein to test a result or performance of step 842. Techniques known to those of skill in the art are used to perform step 842.

In some embodiments, after step 842 and before step 844, method 800 includes features or actions similar or identical to those discussed above with reference to steps 120, 130, and 140 of FIG. 1.

At step 844 ILD, depositions steps are performed to generate one or more dielectric layers. In some embodiments, step 844 is also used to generate a test structure which may be located in a test portion of the semiconductor wafer. The test structure may include features which may be tested using techniques discussed herein to test a result or performance of step 844. Techniques known to those of skill in the art are used to perform step 844.

In some embodiments, after 844 and before 846, method 800 includes features or actions similar or identical to those discussed above with reference to steps 120, 130, and 140 of FIG. 1.

At step 846 CT, contacts are defined for back end of line (BEOL) metal contact formation. In some embodiments, step 846 is also used to generate a test structure which may be located in a test portion of the semiconductor wafer. The test structure may include features which may be tested using techniques discussed herein to test a result or performance of step 846. Techniques known to those of skill in the art are used to perform step 846.

In some embodiments, after step 846 and before another layer generation step (not shown), method 800 includes features or actions similar or identical to those discussed above with reference to steps 120, 130, and 140 of FIG. 1.

In some embodiments, after a first layer generation step not discussed, and before a second layer generation step not discussed, method 800 includes features or actions similar or identical to those discussed above with reference to steps 120, 130, and 140 of FIG. 1.

In some embodiments, after a first layer generation step not discussed, and before a discussed second layer generation step, method 800 includes features or actions similar or identical to those discussed above with reference to steps 120, 130, and 140 of FIG. 1.

In some embodiments, after a discussed first layer generation step, and before a second layer generation step not discussed, method 800 includes features or actions similar or identical to those discussed above with reference to steps 120, 130, and 140 of FIG. 1.

At step 848 WAT, a wafer acceptance test procedure, such as that discussed elsewhere here is performed.

As discussed in further detail above, semiconductor manufacturing processes include formation of multiple individual and distinct layers. The layers may comprise, for example, one or more of a crystalline semiconductor substrate, portions of the substrate each doped with a different dopant species or dopant species concentration, as understood by those of skill in the art, an insulator, such as an oxide, a conductor, such as aluminum, and a resistor, such as polysilicon. Each of the layers is formed by a particular semiconductor manufacturing process, and various characteristics of each layer has some variation because of, for example, variations in temperatures, pressures, durations, recipes, and a number of other manufacturing and environment conditions, for example, as understood by those of skill in the art. Sometimes the variation causes one or more layers to be formed with insufficient quality, such that, for example, the resulting wafer is not usable or of sufficient quality, or such that, for example, the resulting wafer has fewer than an acceptable number of die having circuits which are usable or of sufficient quality.

In various embodiments discussed herein, methods of manufacturing which test for sufficient quality of one or more layers are described. The testing occurs after one or more first layers are formed and before one or more additional layers are formed, where both the first layers and the one or more additional layers collectively form the circuits being fabricated during the manufacturing process. During the testing process, one or more of the first layers are tested. In some embodiments, if the tested layers are found to be of sufficient quality, the semiconductor wafer is further processed such that the additional layers are formed therein and/or thereon. In some embodiments, if the tested layers are found to be of insufficient quality, the semiconductor wafer is removed from the manufacturing process.

One inventive aspect is a method of manufacturing a semiconductor wafer. The method includes exposing the semiconductor wafer to one or more dopant species to form one or more first implant layers on the semiconductor wafer, testing one or more geometric parameter values of the formed one or more first implant layers, after testing the one or more geometric parameter values, conditionally exposing the semiconductor wafer to one or more dopant species to form one or more additional implant layers on the semiconductor wafer, after forming the one or more additional implant layers, conditionally forming one or more additional circuit layers on the semiconductor wafer to form a plurality of functional electronic circuits on the semiconductor wafer, and conditionally testing the semiconductor wafer with a wafer acceptance test (WAT) operation.

In some embodiments, testing the one or more geometric parameter values of the formed one or more first implant layers includes determining the one or more geometric parameter values, and comparing each of the parameter values with a limit.

In some embodiments, forming the one or more first implant layers on the semiconductor wafer includes forming a circuit portion including the one or more first implant layers and forming a test portion including the one or more first implant layers, and testing one or more geometric parameter values of the formed one or more first implant layers includes testing the one or more first implant layers of the test portion.

In some embodiments, forming the one or more first implant layers on the semiconductor wafer includes forming a circuit portion including the one or more first implant layers and forming a test portion including the one or more first implant layers, where the one or more first implant layers of the circuit portion are not tested.

In some embodiments, the one or more first implant layers and the one or more additional implant layers cooperatively at least partly form an electrical circuit configured to process electrical signals.

In some embodiments, if the testing of the one or more geometric parameter values determines that the one or more geometric parameter values are each within one or more specified limits, the one or more additional implant layers are formed on the semiconductor wafer, and if the testing of the one or more geometric parameter values determines that at least one of the one or more geometric parameter values are each outside one or more specified limits, the one or more additional implant layers are not formed on the semiconductor wafer.

Another inventive aspect is a semiconductor wafer, including one or more first implant layers forming a circuit portion and a first test portion, the circuit portion forming an at least partially formed semiconductor circuit, where the one or more first implant layers of the first test portion are exposed by a first cross-section cut in the first test portion, and one or more second implant layers further forming the circuit portion and a second test portion, where the one or more second implant layers of the second test portion are exposed by a second cross-section cut in the second test portion, where the first and second test portions are spaced apart, and where the first and second cross-section cuts do not intersect.

In some embodiments, the first cross-section cut does not expose any of the one or more second implant layers.

In some embodiments, the second cross-section cut does not expose any of the one or more first implant layers.

In some embodiments, the one or more first implant layers forming the first test portion have a dimension exposed by the first cross-section cut which is greater than a dimension of the one or more first implant layers forming the circuit portion in a circuit cross-section, where the circuit cross-section and the first cross-section cut intersect a plane defined by the semiconductor wafer at a same angle.

In some embodiments, the first and second test portions are each surrounded by an isolation structure.

Another inventive aspect is a method of manufacturing a semiconductor wafer, the method including exposing the semiconductor wafer to one or more dopant species to form one or more first implant layers on the semiconductor wafer, cutting the semiconductor wafer to expose the one or more first implant layers, and testing one or more geometric parameter values of the one or more first implant layers, where the testing includes contacting the exposed one or more first implant layers with a probe. The method also includes, after testing the one or more geometric parameter values, conditionally forming one or more metallization layers on the semiconductor wafer to electrically connect a plurality of functional electronic circuits on the semiconductor wafer, and conditionally testing the semiconductor wafer with a wafer acceptance test (WAT) operation.

In some embodiments, the testing includes directly contacting the exposed one or more first implant layers with the probe.

In some embodiments, the one or more geometric parameter values includes at least one dimension of the formed one or more first implant layers.

In some embodiments, testing the one or more geometric parameter values of the formed one or more first implant layers includes determining the one or more geometric parameter values, and comparing each of the parameter values with a limit.

In some embodiments, the method further includes, after forming the one or more additional implant layers on the semiconductor wafer, testing one or more additional geometric parameter values of the formed one or more additional implant layers.

In some embodiments, forming the one or more first implant layers on the semiconductor wafer includes forming a circuit portion including the one or more first implant layers and forming a test portion including the one or more first implant layers, where testing one or more geometric parameter values of the formed one or more first implant layers includes testing the one or more first implant layers of the test portion.

In some embodiments, forming the one or more first implant layers on the semiconductor wafer includes forming a circuit portion including the one or more first implant layers and forming a test portion including the one or more first implant layers, where the one or more first implant layers of the circuit portion are not tested.

In some embodiments, the one or more first implant layers and the one or more additional implant layers cooperatively at least partly form an electrical circuit configured to process electrical signals.

In some embodiments, if the testing of the one or more geometric parameter values determines that the one or more geometric parameter values are each within one or more specified limits, the one or more additional implant layers are formed on the semiconductor wafer, and if the testing of the one or more geometric parameter values determines that at least one of the one or more geometric parameter values are each outside one or more specified limits, the one or more additional implant layers are not formed on the semiconductor wafer.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor wafer, the method comprising:
    exposing the semiconductor wafer to one or more dopant species to form one or more first implant layers on the semiconductor wafer, wherein forming the one or more first implant layers comprises forming a circuit portion comprising the one or more first implant layers and forming a test portion comprising the one or more first implant layers, wherein the circuit portion and the test portion are formed simultaneously;
    scanning, using a characterization system, the first implant layers to obtain an implantation profile of the one or more first implant layers of the test portion by contacting the one or more first implant layers of the test portion with a probe of the characterization system, without contacting the one or more first implant layers of the circuit portion, wherein the implantation profile of the one or more first implant layers of the test portion is a representation of an implantation profile of the one or more first implant layers of the circuit portion;
    comparing the implantation profile of the first implant layers of the test portion with a preset profile for the one or more first implant layers to test one or more geometric parameter values of the one or more first implant layers;
    after testing the one or more geometric parameter values, exposing the semiconductor wafer to one or more dopant species to form one or more additional implant layers on the semiconductor wafer;
    after forming the one or more additional implant layers, forming one or more additional circuit layers on the semiconductor wafer to form a plurality of functional electronic circuits on the semiconductor wafer; and
    testing the semiconductor wafer with a wafer acceptance test (WAT) operation.

2. The method of claim 1, wherein testing the one or more geometric parameter values of the formed one or more first implant layers comprises:
    determining the one or more geometric parameter values; and
    comparing each of the parameter values with a limit.

3. The method of claim 1,
    wherein testing one or more geometric parameter values of the one or more first implant layers comprises testing the one or more first implant layers of the test portion.

4. The method of claim 1, wherein the characterization system comprises a Scanning Spreading Resistance Microscopy (SSRM) method or a Spreading Resistance Profiling (SRP) method.

5. The method of claim 1, wherein the one or more first implant layers and the one or more additional implant layers cooperatively at least partly form an electrical circuit configured to process electrical signals.

6. The method of claim 1, wherein if the testing of the one or more geometric parameter values determines that the one or more geometric parameter values are each within one or more specified limits, the one or more additional implant layers are formed on the semiconductor wafer, and wherein if the testing of the one or more geometric parameter values determines that at least one of the one or more geometric parameter values are each outside one or more specified limits, the one or more additional implant layers are not formed on the semiconductor wafer.

7. A method of manufacturing a semiconductor wafer, the method comprising:
  exposing the semiconductor wafer to one or more dopant species to form one or more first implant layers on the semiconductor wafer, wherein forming the one or more first implant layers comprises forming a circuit portion comprising the one or more first implant layers and forming a test portion comprising the one or more first implant layers, wherein the circuit portion and the test portion are formed simultaneously;
  cutting the semiconductor wafer to expose the one or more first implant layers;
  scanning, using a characterization system, the first implant layers to obtain an implantation profile of the one or more first implant layers of the test portion by contacting the one or more first implant layers of the test portion with a probe of the characterization system, without contacting the one or more first implant layers of the circuit portion, wherein the implantation profile of the one or more first implant layers of the test portion is a representation of an implantation profile of the one or more first implant layers of the circuit portion;
  comparing the implantation profile of the first implant layers of the test portion with a preset profile for the one or more first implant layers to test one or more geometric parameter values of the one or more first implant layers;
  after testing the one or more geometric parameter values, forming one or more metallization layers on the semiconductor wafer to electrically connect a plurality of functional electronic circuits on the semiconductor wafer; and
  testing the semiconductor wafer with a wafer acceptance test (WAT) operation.

8. The method of claim 7, wherein the testing comprises directly contacting the exposed one or more first implant layers with the probe.

9. The method of claim 7, wherein the one or more geometric parameter values comprises at least one dimension of the formed one or more first implant layers.

10. The method of claim 7, wherein testing the one or more geometric parameter values of the formed one or more first implant layers comprises:
  determining the one or more geometric parameter values; and
  comparing each of the parameter values with a limit.

11. The method of claim 7, further comprising, after forming the one or more additional implant layers on the semiconductor wafer, testing one or more additional geometric parameter values of the formed one or more additional implant layers.

12. The method of claim 7,
  wherein testing one or more geometric parameter values of the formed one or more first implant layers comprises testing the one or more first implant layers of the test portion.

13. The method of claim 7, wherein the characterization system comprises a Scanning Spreading Resistance Microscopy (SSRM) method or a Spreading Resistance Profiling (SRP) method.

14. The method of claim 7, wherein the one or more first implant layers and the one or more additional implant layers cooperatively at least partly form an electrical circuit configured to process electrical signals.

15. The method of claim 7, wherein if the testing of the one or more geometric parameter values determines that the one or more geometric parameter values are each within one or more specified limits, the one or more additional implant layers are formed on the semiconductor wafer, and wherein if the testing of the one or more geometric parameter values determines that at least one of the one or more geometric parameter values are each outside one or more specified limits, the one or more additional implant layers are not formed on the semiconductor wafer.

16. A method of manufacturing a semiconductor wafer, the method comprising:
  exposing the semiconductor wafer to one or more dopant species to form one or more first implant layers on the semiconductor wafer, wherein forming the one or more first implant layers comprises forming a circuit portion comprising the one or more first implant layers and forming a test portion comprising the one or more first implant layers, wherein the circuit portion and the test portion are formed simultaneously;
  scanning, using a characterization system, the first implant layers to obtain an implantation profile of the one or more first implant layers of the test portion by contacting the one or more first implant layers of the test portion with a probe of the characterization system, without contacting the one or more first implant layers of the circuit portion, wherein the implantation profile of the one or more first implant layers of the test portion is a representation of an implantation profile of the one or more first implant layers of the circuit portion;
  comparing the implantation profile of the first implant layers of the test portion with a preset profile for the one or more first implant layers to test one or more geometric parameter values of the one or more first implant layers; and
  after testing the one or more geometric parameter values, exposing the semiconductor wafer to one or more dopant species to form one or more additional implant layers on the semiconductor wafer.

17. The method of claim 16, wherein testing the one or more geometric parameter values of the formed one or more first implant layers comprises:
  determining the one or more geometric parameter values; and
  comparing each of the parameter values with a limit.

18. The method of claim 16,
  wherein testing one or more geometric parameter values of the formed one or more first implant layers comprises testing the one or more first implant layers of the test portion.

19. The method of claim 16, wherein the characterization system comprises a Scanning Spreading Resistance Microscopy (SSRM) method or a Spreading Resistance Profiling (SRP) method.

20. The method of claim 16, wherein if the testing of the one or more geometric parameter values determines that the one or more geometric parameter values are each within one or more specified limits, the one or more additional implant layers are formed on the semiconductor wafer, and wherein if the testing of the one or more geometric parameter values determines that at least one of the one or more geometric parameter values are outside one or more specified limits, the one or more additional implant layers are not formed on the semiconductor wafer.

* * * * *